United States Patent
Tian et al.

(10) Patent No.: US 12,306,540 B2
(45) Date of Patent: May 20, 2025

(54) TWO-DIMENSIONAL (2D) PATTERNS USING MULTIPLE EXPOSURES OF ONE-DIMENSIONAL (1D) PHOTOLITHOGRAPHY MASKS OR HOLOGRAPHIC INTERFERENCE LITHOGRAPHY

(71) Applicant: GOOGLE LLC, Mountain View, CA (US)

(72) Inventors: Lu Tian, Palo Alto, CA (US); Wei Jin, Saratoga, CA (US); Joseph Daniel Lowney, Tucson, AZ (US); Thomas Mercier, Weston, FL (US)

(73) Assignee: GOOGLE LLC, Mountain View, CA (US)

( * ) Notice: Subject to any disclaimer, the term of this patent is extended or adjusted under 35 U.S.C. 154(b) by 260 days.

(21) Appl. No.: 18/080,431

(22) Filed: Dec. 13, 2022

(65) Prior Publication Data
US 2024/0192606 A1 Jun. 13, 2024

(51) Int. Cl.
*G03F 7/00* (2006.01)
*G03F 1/70* (2012.01)
*G03F 7/20* (2006.01)

(52) U.S. Cl.
CPC ............ *G03F 7/70216* (2013.01); *G03F 1/70* (2013.01); *G03F 7/2022* (2013.01)

(58) Field of Classification Search
CPC ....... G03F 7/70216; G03F 1/70; G03F 7/2022
See application file for complete search history.

(56) References Cited

U.S. PATENT DOCUMENTS

| 8,293,460 | B2 * | 10/2012 | Chen | ...................... G03F 7/091 |
| | | | | 430/394 |
| 10,007,177 | B2 * | 6/2018 | Weng | ...................... G03F 7/203 |
| 2002/0030802 | A1 | 3/2002 | Sugita et al. | |
| 2005/0238965 | A1 | 10/2005 | Tyrrell et al. | |
| 2007/0097470 | A1 | 5/2007 | Schneider et al. | |
| 2010/0284001 | A1 | 11/2010 | Moskovits et al. | |
| 2011/0310374 | A1 * | 12/2011 | Solak | ...................... G03F 7/201 |
| | | | | 355/77 |

OTHER PUBLICATIONS

Lance Mosher et al, "Double-Exposure Grayscale Photography"; Journal of Microelectromechanical System; vol. 18, No. 2, (Apr. 13, 2009).*

Moon, Jun Hyuk et al., "Multiple-exposure holographic lithography with phase shift", Applied Physics Letters, V. 85, No. 18, Nov. 1, 2004, 3 pages.

* cited by examiner

*Primary Examiner* — Hung V Nguyen
*Assistant Examiner* — Hung Henry Nguyen

(57) ABSTRACT

Systems and methods are provided for generating a two-dimensional pattern on a photoresist layer. A photoresist layer is exposed via a first exposure to a first unidimensional series of features alternatingly providing first minima and maxima of illumination intensity along a first dimension. The photoresist layer is then exposed via a second exposure to a second unidimensional series of features alternatingly providing second minima and maxima of illumination intensity along a second dimension that is angularly separated from the second dimension by an exposure rotation factor.

20 Claims, 17 Drawing Sheets

TWO-DIMENSIONAL (2D) PATTERNS USING MULTIPLE EXPOSURES OF ONE-DIMENSIONAL (1D) PHOTOLITHOGRAPHY MASKS OR HOLOGRAPHIC INTERFERENCE LITHOGRAPHY

BACKGROUND

The present disclosure relates generally to the creation of two-dimensional (2D) illumination patterns, such as may be used to create photolithographic masks or other articles. In integrated circuit and optical waveguide manufacturing, photolithography or optical lithography is a general term used for techniques that use light to produce minutely patterned thin films of suitable materials over a substrate, such as a silicon wafer or optical substrate, to protect selected areas of the wafer or substrate during subsequent etching, deposition, or implantation operations. Typically, ultraviolet light is used to transfer a geometric design from an optical mask to a light-sensitive chemical (photoresist) coated on the substrate. The photoresist either breaks down or hardens where it is exposed to light. The patterned film is then created by removing the softer parts of the coating with appropriate solvents.

These photolithographic processes may be utilized in the fabrication of surface treatments for optical lenses, other optical components, microelectronic devices, semiconductors, and micro-electro-mechanical systems (MEMS) devices.

BRIEF SUMMARY OF EMBODIMENTS

In an embodiment, a method comprises exposing a photoresist layer via a first exposure to a first unidimensional series of features alternatingly providing first minima and maxima of illumination intensity along a first dimension; and exposing the photoresist layer via a second exposure to a second unidimensional series of features alternatingly providing second minima and maxima of illumination intensity along a second dimension such that the second dimension is angularly separated from the first dimension by an exposure rotation factor.

Exposing the photoresist layer via the first exposure may include exposing the photoresist layer to a light source via a one-dimensional (1D) masking layer positioned between the photoresist layer and the light source. Exposing the photoresist layer via the second exposure may include exposing the photoresist layer to the light source via the 1D masking layer positioned between the photoresist layer and the light source, and the method may further include rotating the 1D masking layer by the exposure rotation factor prior to exposing the photoresist layer via the second exposure.

Exposing the photoresist layer via the first exposure may include exposing the photoresist layer to an interference pattern between two or more coherent light sources. Exposing the photoresist layer via the second exposure may include exposing the photoresist layer to the interference pattern, such that the method further includes rotating the interference pattern by the exposure rotation factor prior to exposing the photoresist layer via the second exposure.

The first unidimensional series of features and the second unidimensional series of features may be substantially identical.

The first unidimensional series of features may be defined by a first set of parameters, and the second unidimensional series of features may be defined by a second set of parameters that is at least partially distinct from the first set of parameters. The first and second set of parameters may each include one or more of a group that includes a pitch or a fill factor.

The method may further include generating one or more two-dimensional photoresist masking patterns based on the photoresist layer after the second exposure. Generating the one or more two-dimensional photoresist masking patterns based on the exposed photoresist layer may include selecting one or more development parameters for each of the two-dimensional photoresist masking patterns.

In an embodiment, a system includes a photoresist layer; a first unidimensional series of features to provide first minima and maxima of illumination intensity along a first dimension during a first exposure of the photoresist layer; and a second unidimensional series of features to alternatingly provide second minima and maxima of illumination intensity along a second dimension during a second exposure of the photoresist layer, such that the second dimension is angularly separated from the first dimension by an exposure rotation factor.

The first unidimensional series of features may include a one-dimensional (1D) masking layer positioned between the photoresist layer and a light source, such that the first exposure comprises exposing the photoresist layer to the light source via the 1D masking layer. The second exposure may include exposing the photoresist layer to the light source via the 1D masking layer, such that the 1D masking layer is rotated by the exposure rotation factor prior to the second exposure.

The first unidimensional series of features may comprise an interference pattern between two or more coherent light sources. The second unidimensional series of features may also comprise the interference pattern, such that the interference pattern is rotated by the exposure rotation factor prior to the second exposure.

The first unidimensional series of features and the second unidimensional series of features may be substantially identical.

The first unidimensional series of features may be defined by a first set of parameters, such that the second unidimensional series of features is defined by a second set of parameters that is at least partially distinct from the first set of parameters. The first and second set of parameters may each include one or more of a group that includes a pitch or a fill factor.

The system may further include a photoresist developer to generate one or more two-dimensional photoresist masking patterns based on the photoresist layer after the second exposure. The photoresist developer may be configured to select one or more development parameters for each of the two-dimensional photoresist masking patterns.

In an embodiment, a method comprises providing, to a photoresist layer via a masking layer interposed between the photoresist layer and a light source, alternating first minima and maxima of illumination intensity along a first dimension; and providing, to the photoresist layer and via the masking layer, alternating second minima and maxima of illumination intensity along a second dimension that is angularly separated from the first dimension.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

FIGS. 5-1 through 5-4 (collectively referenced as FIG. 5) depict various distinct 2D photoresist masking patterns generated by rotationally adjusting a 1D mask by an exposure rotation factor prior to a second exposure, in accordance with some embodiments.

FIGS. 6-1 through 6-4 (collectively referenced as FIG. 6) depict various distinct 2D photoresist masking patterns generated by rotationally adjusting a 1D mask by an exposure rotation factor prior to a second exposure having a reduced exposure dosage, in accordance with some embodiments.

FIGS. 7-1 through 7-4 (collectively referenced as FIG. 7) depict various distinct 2D photoresist masking patterns generated by using two angularly separated 1D masks defined by one or more disparate parameters, in accordance with some embodiments.

DETAILED DESCRIPTION

Previous lithographic approaches for 2D grating pattern generation have involved creating separate 2D photolithographic masks (masks) for each variation of multiple design parameters, such as pattern length, width, pitch, shape, and the like. Alternative approaches for 2D grating pattern generation have utilized electron-beams (e-beams) to directly write the relevant 2D patterns onto thin films to use as photolithographic masks. However, both of these previous approaches involve relatively long process times for creating large-scale patterns.

Embodiments described herein provide flexible processes to generate 2D periodic nanoscale patterns using a sequence of multiple exposures via one or more 1D masks or holographic interference lithography. Such processes enable faster manufacturing of 2D masks used, for example, in optical diffraction gratings, semiconductor fabrication, and other applications of two-dimensional nanoscale photoresist patterns. Moreover, such techniques are well-suited for fast 2D mask creation in research and development, due to increased associated flexibility, speed, and cost-effectiveness.

In certain embodiments described herein, a 1D mask comprises a substantially planar layer having a unidimensional series of alternating open features (partially or substantially transparent features that provide an intensity maximum by allowing energy from a light source to pass through the substantially planar layer) and closed features (partially or substantially opaque features that prevent energy from a light source from passing through the substantially planar layer), such that the series of features respectively provides alternating minima and maxima of illumination intensity along a single dimension.

Although various such embodiments are described below that utilize multiple exposures of 1D photolithographic masks, in other embodiments multiple exposures may utilize holographic interference lithography (holographic lithography) to provide substantially similar effects. In holographic lithography, an interference pattern between two or more coherent light sources is generated and recorded in a photoresist layer. In certain embodiments, this interference pattern forms a periodic unidimensional series of features providing alternating illumination intensity minima and maxima in a manner similar to that provided via a 1D mask. Upon one or more post-exposure photolithographic processing operations, a photoresist pattern corresponding to the periodic intensity pattern is created.

Figure 1:
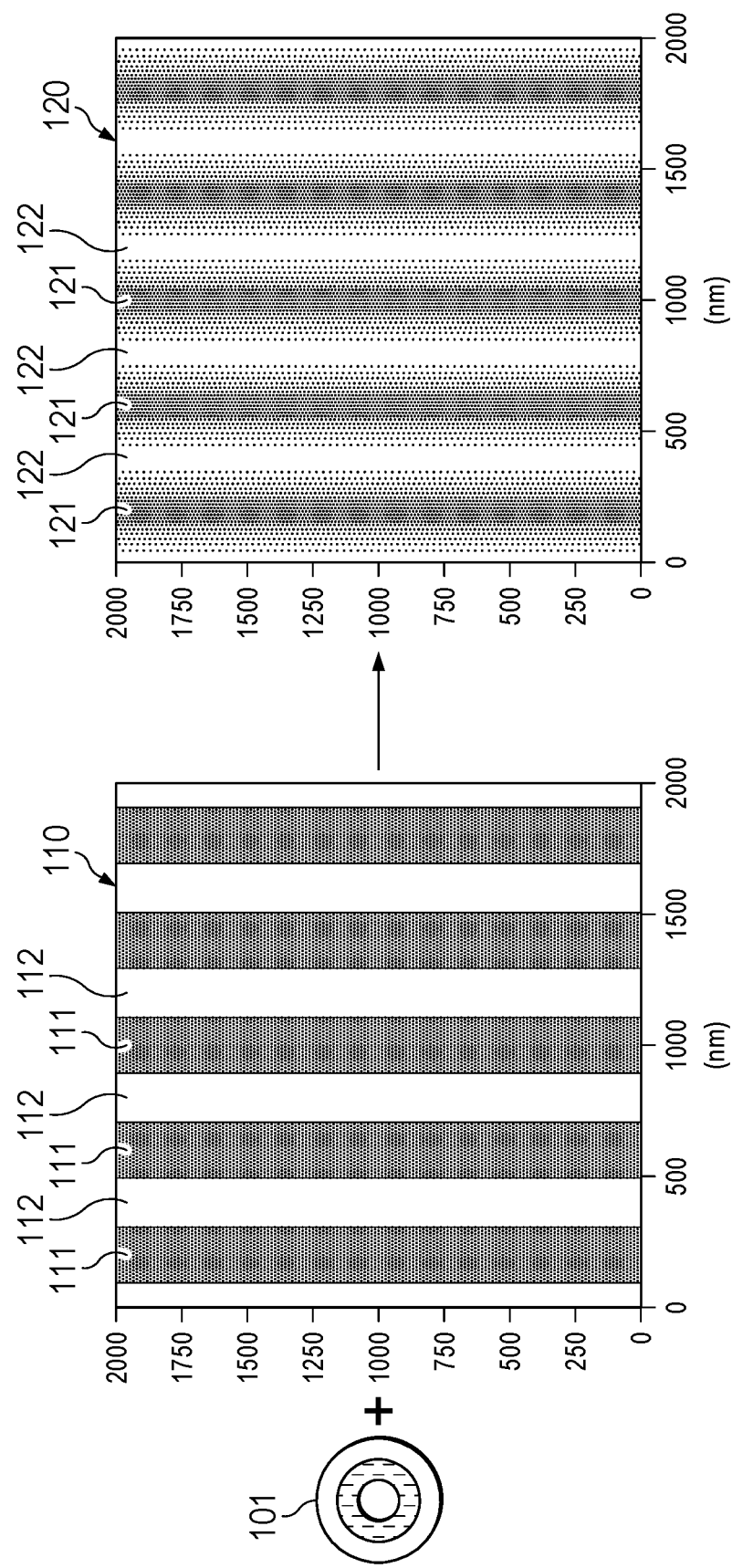
FIG. 1 illustrates a photolithographic exposure scenario using an annular light source and a one-dimensional mask.

FIG. 1 illustrates a photolithographic exposure scenario using an annular light source 101 and a one-dimensional (1D) mask 110. A top-down depiction of the 1D mask 110 includes an alternating vertical series of open (transparent/unblocked) mask portions 111 and closed (opaque/blocked) mask portions 112. FIG. 1 further depicts a top-down view of an exposed photoresist layer 120 resulting from exposure to the annular light source 101 through the 1D mask 110, with variations in the top-down view illustrating relative resultant light intensities received at that photoresist layer. In particular, higher-intensity exposure areas 120-1 alternate with lower-intensity exposure areas 120-2, which directly and respectively correspond to the open mask portions 111 and closed mask portions 112 of the 1D mask 110. A dimensional scale of the 1D mask 110 and the exposed photoresist layer 120 is provided via the respective x- and y-axes, indicating that each comprises a square area of 2 μm×2 μm.

As noted above, rather than using the 1D mask 110, in certain embodiments holographic lithography is used to create an exposure pattern with parameters substantially identical to those provided by exposure via the 1D mask 110.

Although embodiments and scenarios discussed herein are presented in the context of exposure via an annular light source such as the annular light source 101, it will be appreciated that in various embodiments and scenarios, other types and configurations of light sources may be used.

Figure 2:
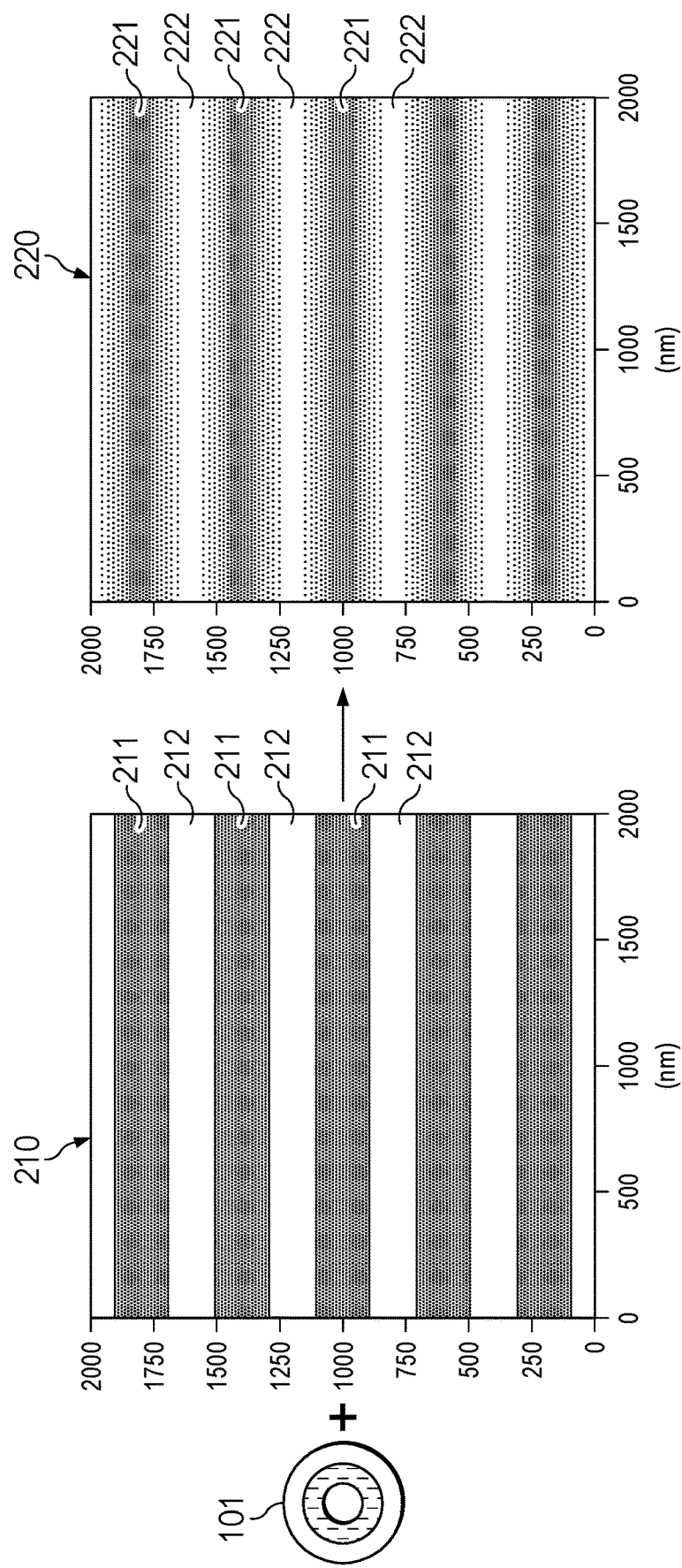
FIG. 2 illustrates another photolithographic exposure scenario using an annular light source and a one-dimensional mask.

FIG. 2 illustrates another photolithographic exposure scenario using the annular light source 101 and a 2 μm×2 μm 1D mask 210, which is substantially identical to (i.e., maintains relevant parameters of) the 1D mask 110 of FIG. 1, but is rotationally adjusted by an exposure rotation factor of 90° with respect to the orientation of that 1D mask 110. Thus, in the exposure scenario of FIG. 2, a top-down depiction of the 1D mask 210 includes an alternating horizontal series of open mask portions 211 and closed mask portions 212. FIG. 2 further includes a top-down view of an exposed photoresist layer 220 resulting from exposure to the annular light source 101 through the 1D mask 210, with variations in the top-down view again illustrating the resulting relative light intensities received at that photoresist layer. In particular, higher-intensity exposure areas 220-1 alternate with lower-intensity exposure areas 220-2, which directly and respectively correspond to the open mask portions 211 and closed mask portions 212 of the 1D mask 210.

Figure 3:
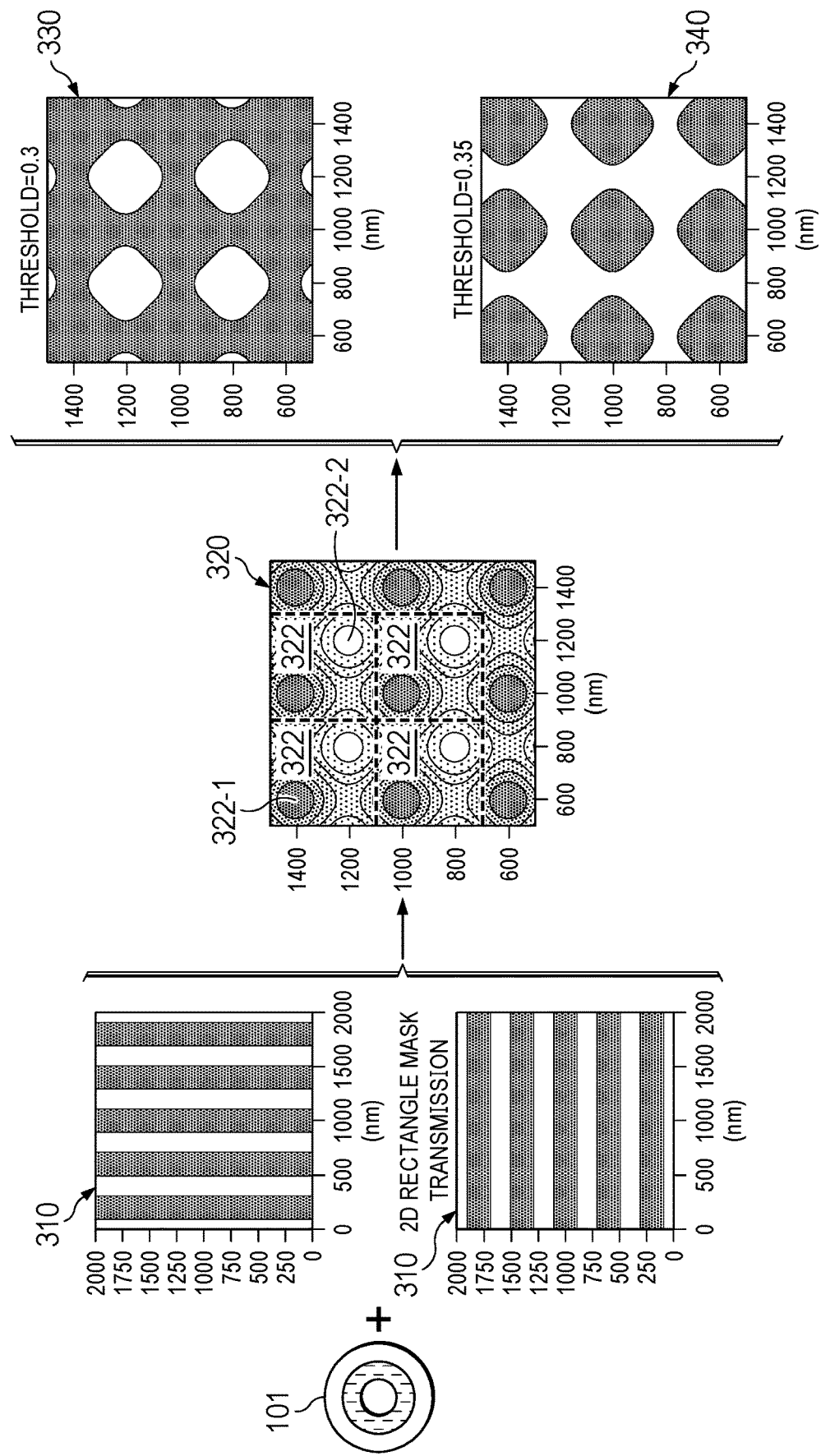
FIG. 3 illustrates a photolithographic multiple-exposure scenario using an annular light source and a one-dimensional mask in accordance with some embodiments.

FIG. 3 illustrates a photolithographic exposure scenario using the annular light source 101 and a 1D mask 310 in accordance with some embodiments. In the depicted embodiment, the annular light source 101 is used to create a first exposure of a photoresist layer 320 using the 1D mask 310 in a vertical configuration (similar to the orientation described above with respect to 1D mask 110 of FIG. 1), and again used to then create a second exposure of the same photoresist layer 320 using the 1D mask 310 in a horizontal configuration (similar to the orientation described above with respect to 1D mask 210 of FIG. 2). As a result, the photoresist layer 320 exhibits a pattern of unit cell regions 322 that are each exposed to varied relative light intensities due to the first and second exposures. In particular, in a manner similar to that noted above with respect to photoresist layers 120 and 220, each of multiple unit cell regions 322 includes higher-intensity exposure areas 322-1 and low-intensity exposure areas 322-2.

In certain embodiments, the photoresist layer 320 may be developed in accordance with various thresholds, each of which corresponds to a distinct set of photoresist chemical properties and process condition parameters (e.g., photoresist layer thickness, heating temperature, etc.). As a result, the same double-exposure technique may be used to yield a variety of pillars (regions in which the photoresist layer preserves underlying material) or holes (regions in which the photoresist layer is used to remove underlying material, such as via one or more etching processes). For ease of illustration, in the depicted embodiment such sets of chemical properties and process condition parameters are represented as a single numerical threshold value referred to herein as a development threshold. For example, in the depicted embodiment a first developed photoresist layer 330 corresponds to a development threshold of 0.3, while a second developed photoresist layer 340 corresponds to a development threshold of 0.35. Such distinct development thresholds may be used to generate multiple 2D photoresist masks from the same configuration of exposures from the same 1D mask. For example, disparate development thresholds may be utilized to form complementary pillar/hole configurations, rather than doing so by exposing photoresist elements having opposing polarities.

As noted above, rather than using the 1D mask 310, in certain embodiments holographic lithography is used to create an exposure pattern with parameters substantially identical to those provided by exposure via the 1D mask 310.

Figure 4:
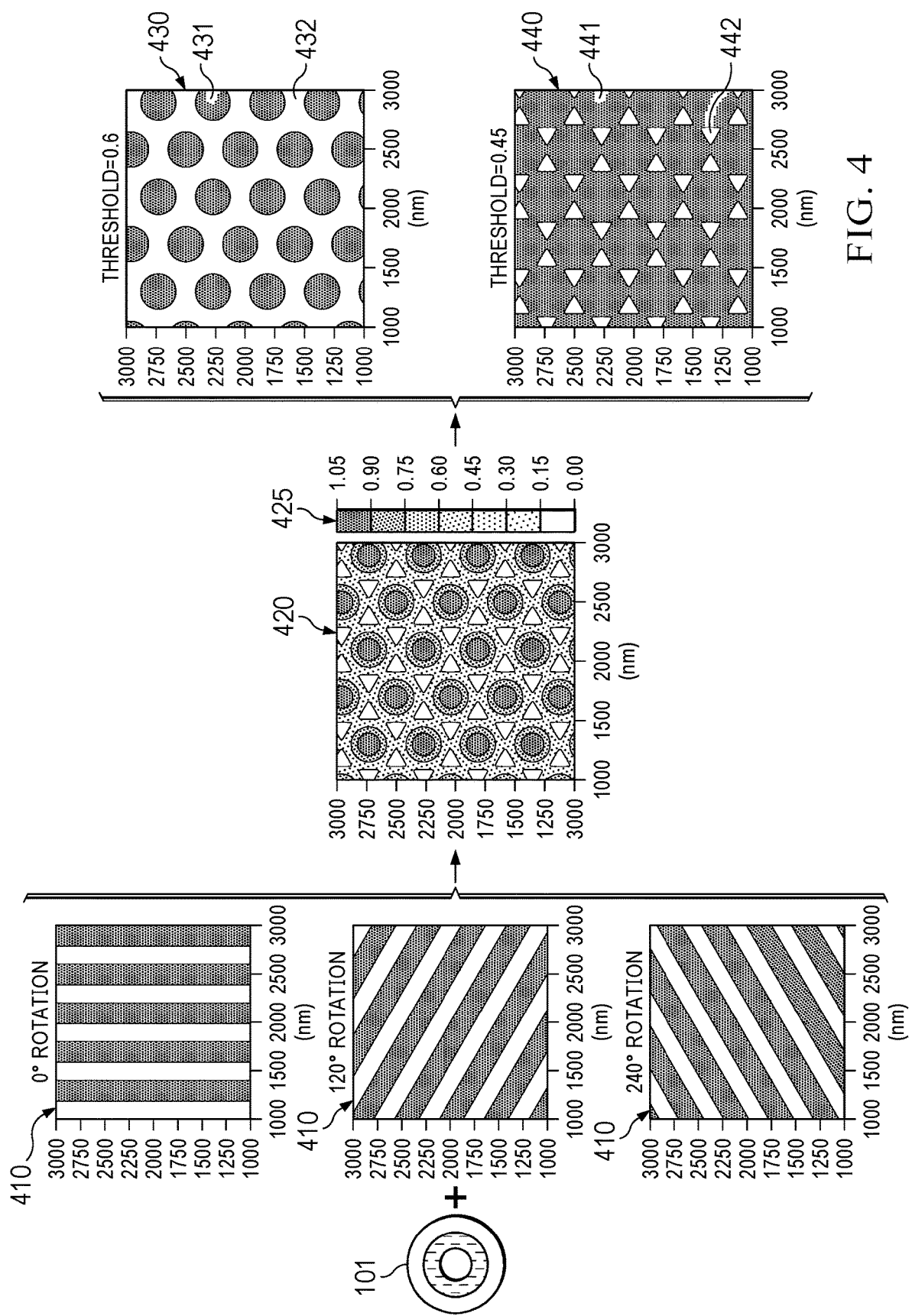
FIG. 4 illustrates another photolithographic multiple-exposure scenario using an annular light source and a one-dimensional mask in accordance with some embodiments.

FIG. 4 illustrates another photolithographic exposure scenario using an annular light source 101 and a 1D mask 410 in accordance with some embodiments. In the depicted embodiment, a 2D unit cell pattern having three-axis symmetry is created via three separate exposures of a rotationally adjusted 1D mask 410, which in the illustrated scenario has an example pitch parameter of 400 nm (indicating the period of the 1D mask, or the spacing between repeated features thereof) and a fill factor parameter of 50% (indicating that half of the surface area is open and the other half of the surface area is closed).

In the depicted embodiment, the annular light source 101 is used to create a first exposure of a photoresist layer 420 using the 1D mask 410 in a vertical configuration, referred to herein as 0° rotation (similar to the orientation described above with respect to 1D mask 110 of FIG. 1); a second exposure of the same photoresist layer 420 with the 1D mask 410 rotationally adjusted by 120° relative to that used for the first exposure; and a third exposure of the same photoresist layer 420 with the 1D mask 410 rotationally adjusted by 240° relative to that used for the first exposure. (It will be appreciated that in various embodiments and scenarios, an alternative sequence of exposures using the 1D mask 410 may be utilized, such as by exposing the photoresist layer 420 via the 240° rotation of the 1D mask 410 prior to exposing the photoresist layer 420 via the 120° rotation of the 1D mask 410, or other sequence.) As a result, the photoresist layer 420 exhibits a triangularly symmetrical pattern of unit cell regions having varied relative light intensities due to the first, second, and third exposures.

In a manner similar to that described above with respect to developed photoresist layers 330, 340 of FIG. 3, various distinct developed photoresist masking patterns may be generated using the triple-exposure technique described above in accordance with various development thresholds. For reference, FIG. 4 includes a development threshold index 425, graphically depicting a delineation of development thresholds between 0.00 and 1.05.

In accordance with the development threshold index 445, a developed photoresist layer 430 using a development threshold of 0.6 includes a pattern of hexagonally arranged circular high-intensity exposure regions 431, surrounded by a low-intensity exposure region 432. In contrast, a developed photoresist layer 440 using a development threshold of 0.45 includes a hexagonally arranged pattern of triangular low-intensity exposure regions 442, surrounded by a high-intensity exposure region 441. Thus, various development thresholds may be utilized to configure and generate wide varieties of distinct developed photoresist masking patterns.

As noted above, rather than using the 1D mask 410, in certain embodiments holographic lithography is used to create an exposure pattern with parameters substantially identical to those provided by exposure via the 1D mask 410.

In various scenarios and embodiments, a unit cell pattern generated in a 2D photolithographic mask may be tuned by modifying a rotation angle of one or more successive exposures, as described below.

Figures 1, 5:
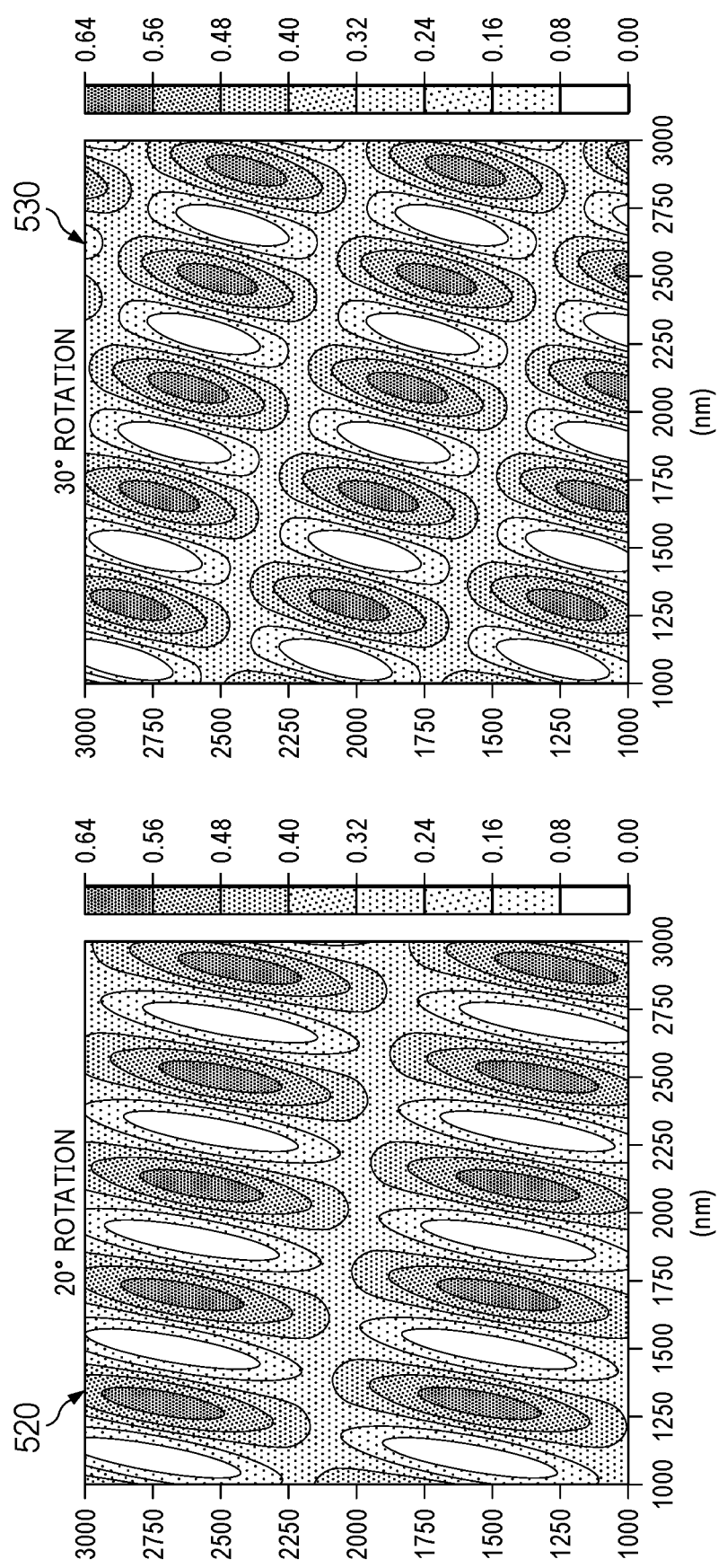
Figures 2, 5:
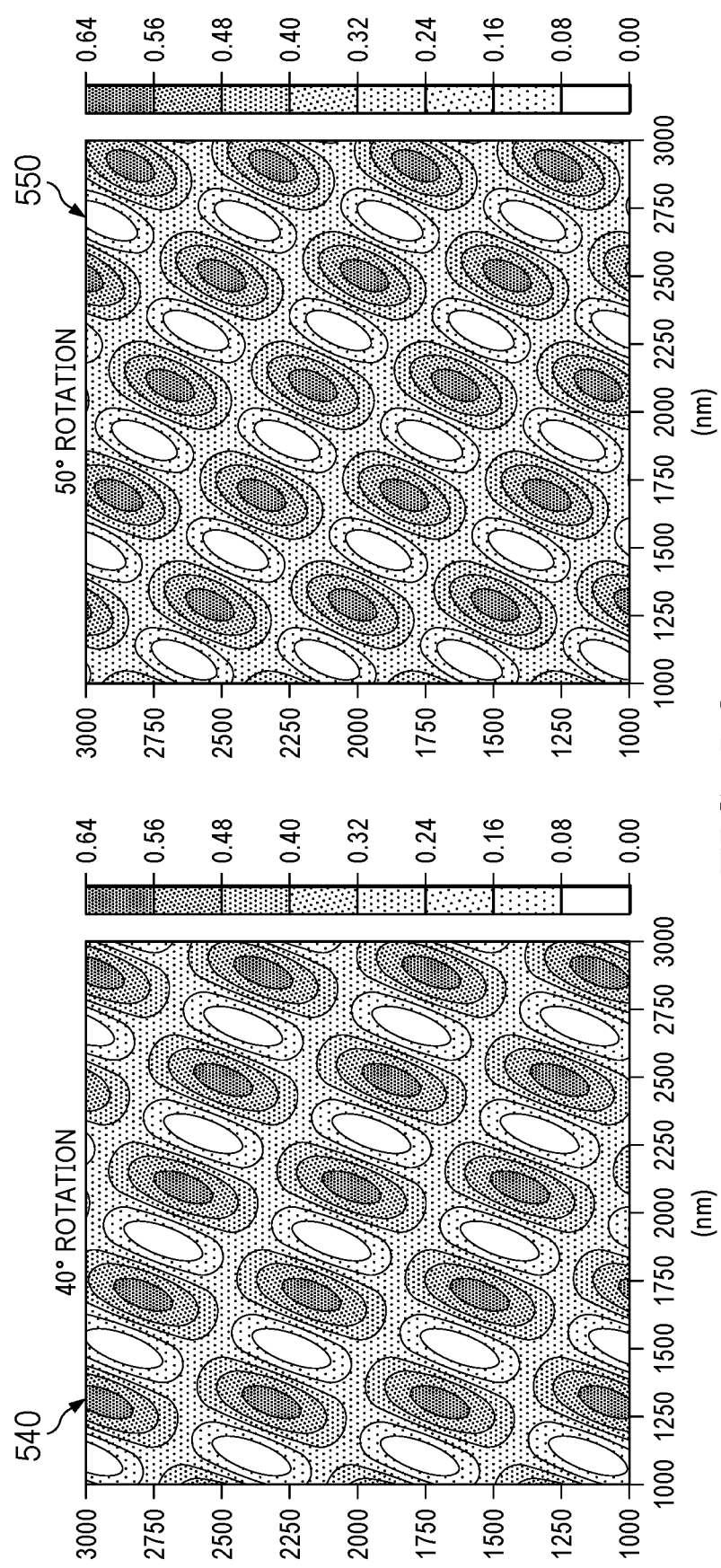
Figures 3, 5:
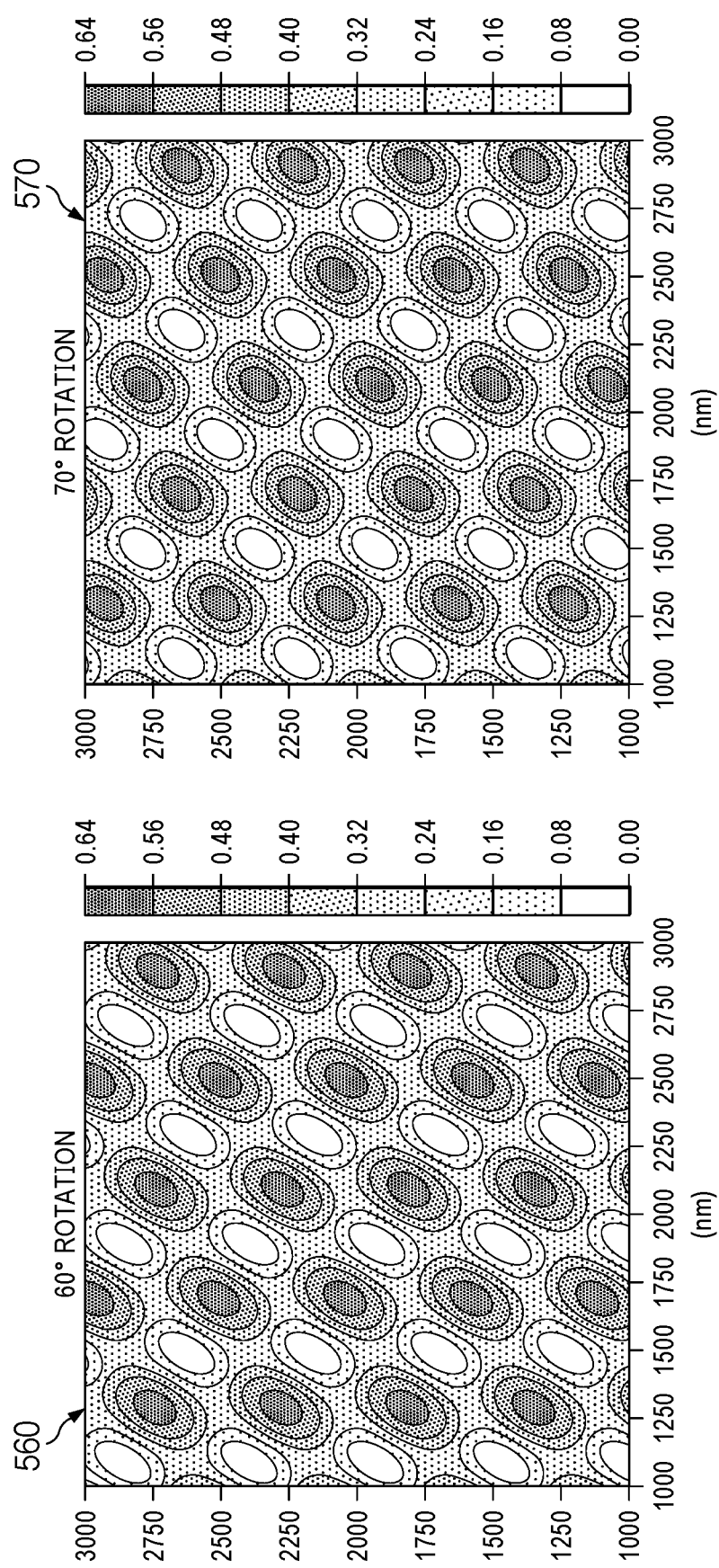
Figures 4, 5:
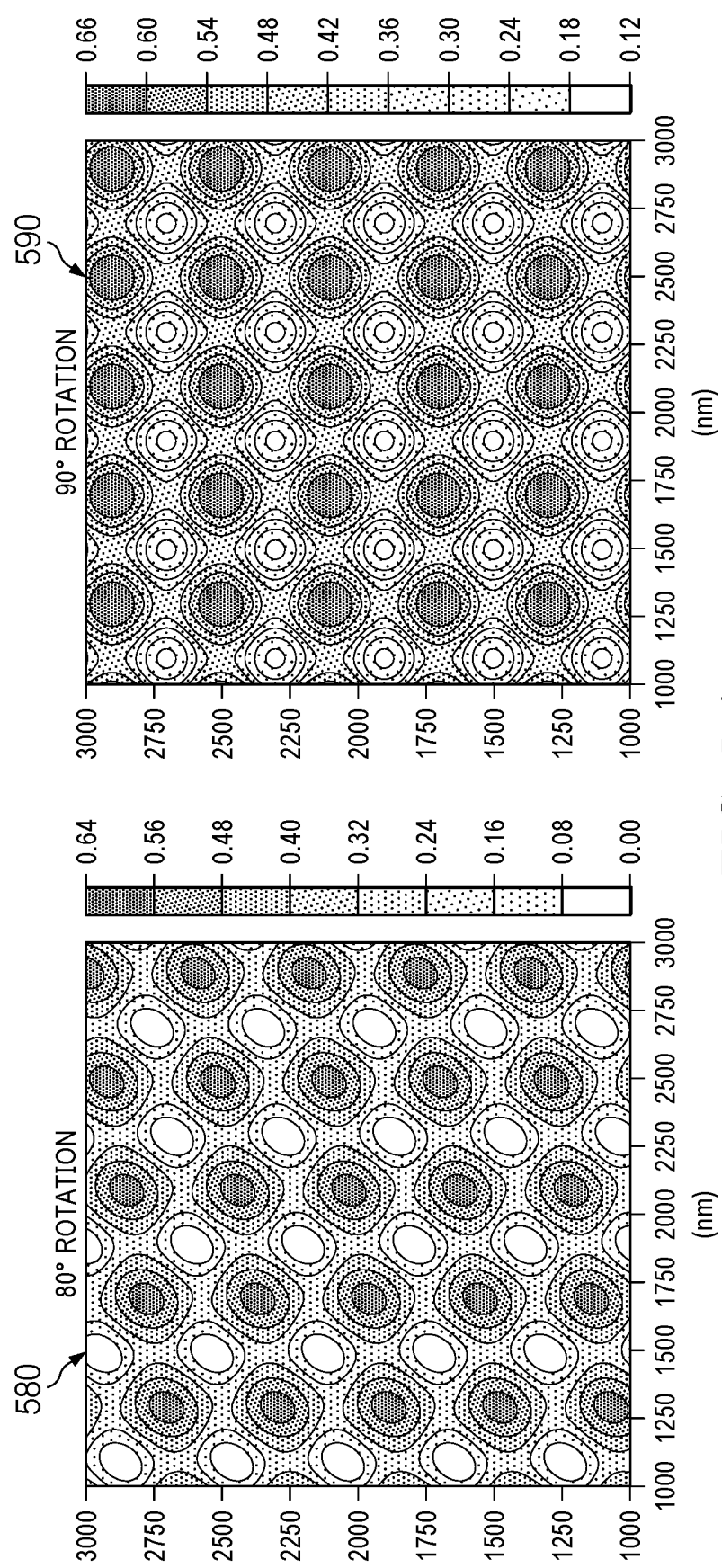

FIG. 5 depicts eight distinct 2D photoresist masking patterns 520, 530, 540, 550, 560, 570, 580, 590 generated by rotationally adjusting a 1D mask (such as one of 1D masks 110, 210, 310, 410 of FIGS. 1-4, respectively) for a second exposure in a manner similar to that described above with respect to FIG. 3. That is, each of the 2D photo masking patterns 520, 530, 540, 550, 560, 570, 580, 590 are generated by exposing a respective photoresist layer via the same 1D mask for a first exposure, and then rotating that 1D mask by a different angle of rotation for a second exposure.

In particular, photoresist layer 520 is generated by rotating a 1D mask by 20° for a second exposure; photoresist layer 530 is generated by rotating the 1D mask by 30° for the second exposure; photoresist layer 540 is generated by rotating the 1D mask by 40° for the second exposure; photoresist layer 550 is generated by rotating the 1D mask by 50° for the second exposure; photoresist layer 560 is generated by rotating the 1D mask by 60° for the second exposure; photoresist layer 570 is generated by rotating the 1D mask by 70° for the second exposure; photoresist layer 580 is generated by rotating the 1D mask by 80° for the second exposure; and photoresist layer 590 is generated by rotating the 1D mask by 90° for the second exposure (in a manner similar to the 90° rotation of 1D mask 310 described with respect to FIG. 3 above).

As can be seen from the respective photoresist layers depicted in FIG. 5, the resulting unit cell patterns, as well as the shape of their respective internal high-intensity and low-intensity exposure regions, vary widely between those respective photoresist layers. Thus, in addition to configuring and generating disparate varieties of developed photoresist masking patterns by tuning their respective development thresholds, additional varieties of photoresist masking patterns may be configured and generated by adjusting a rotational angle of the 1D mask used for successive exposures.

In various scenarios and embodiments, a unit cell pattern generated in a 2D photolithographic mask may be tuned by modifying a dosage applied to the 2D photolithographic mask during one or more successive exposures, as described below.

Figures 1, 6:
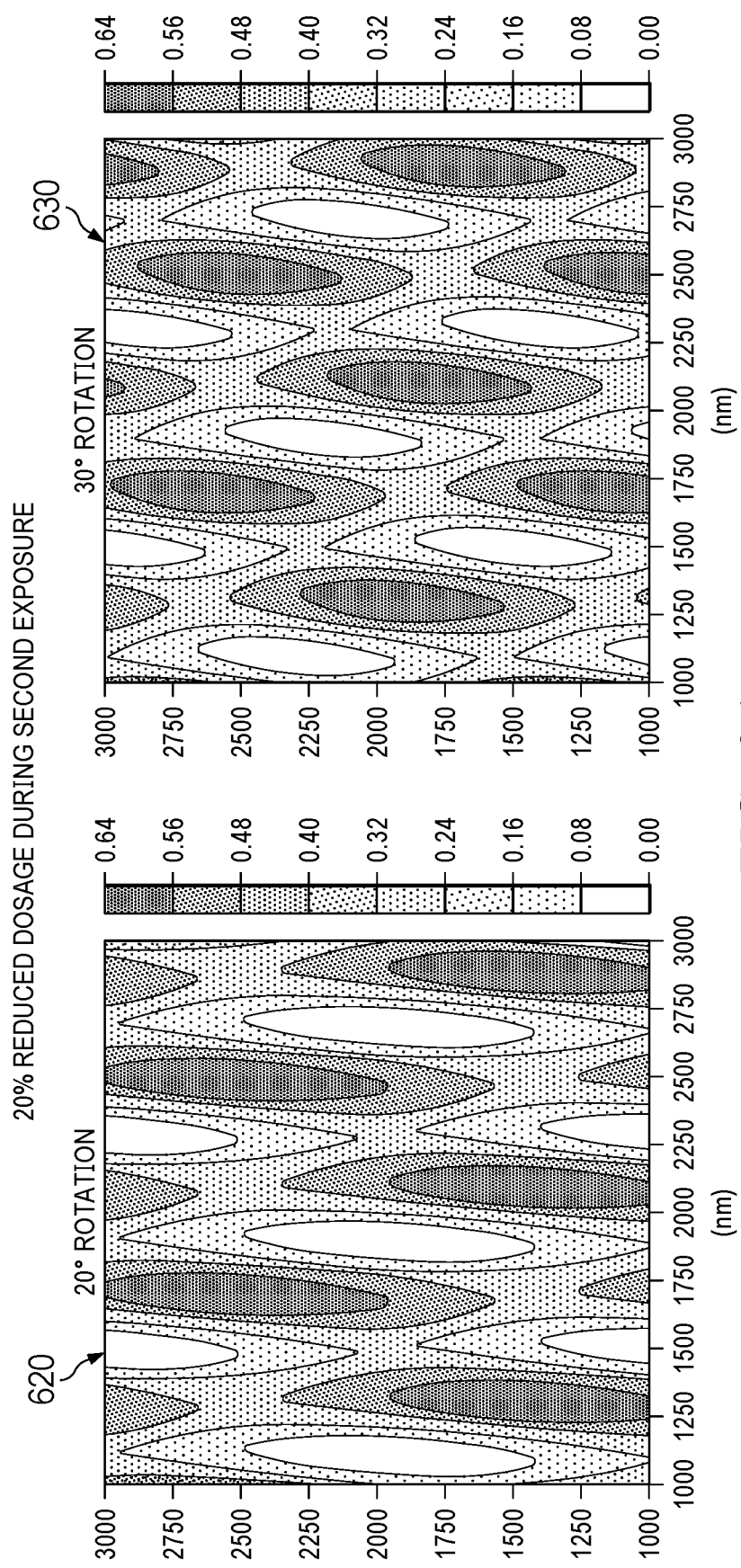
Figures 2, 6:
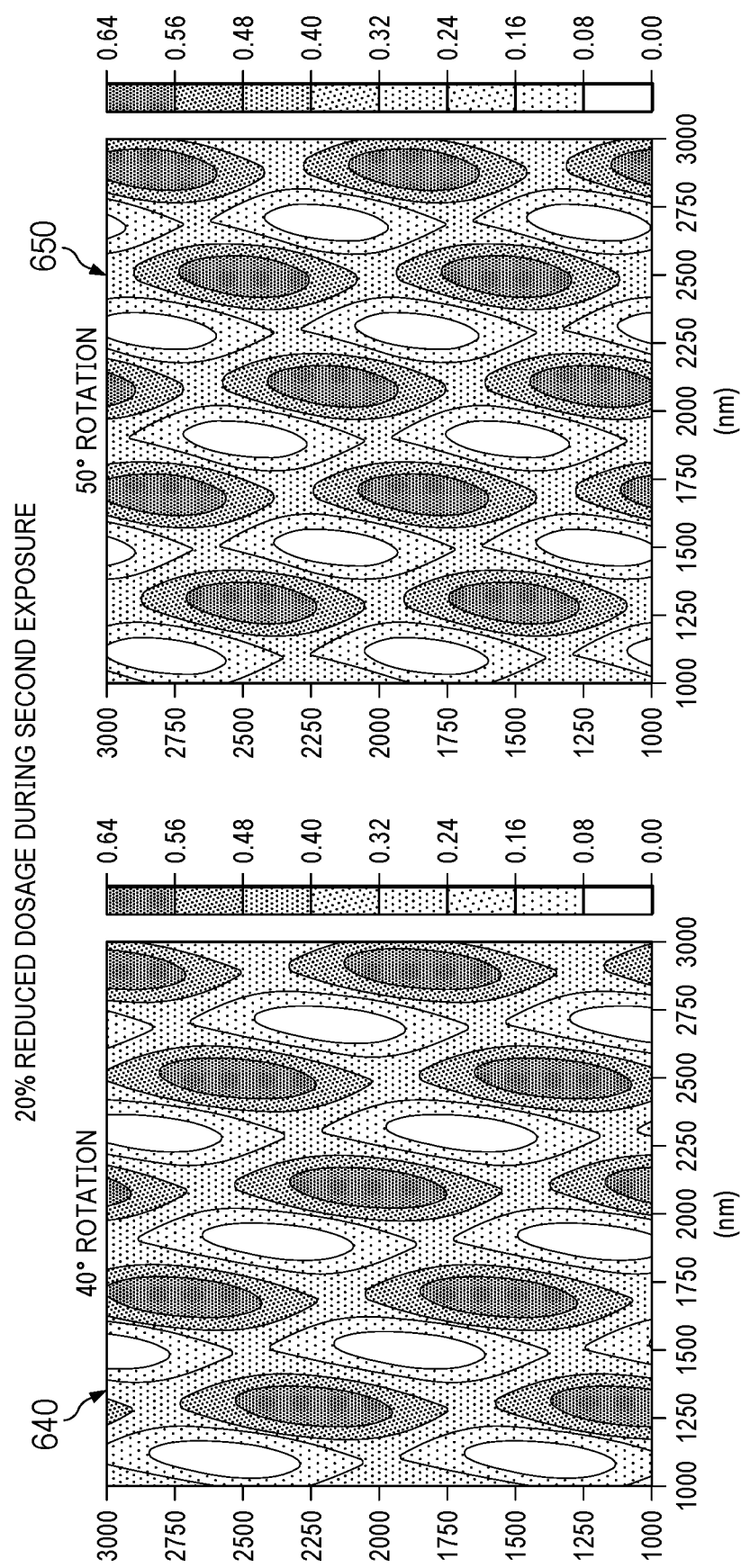
Figures 3, 6:
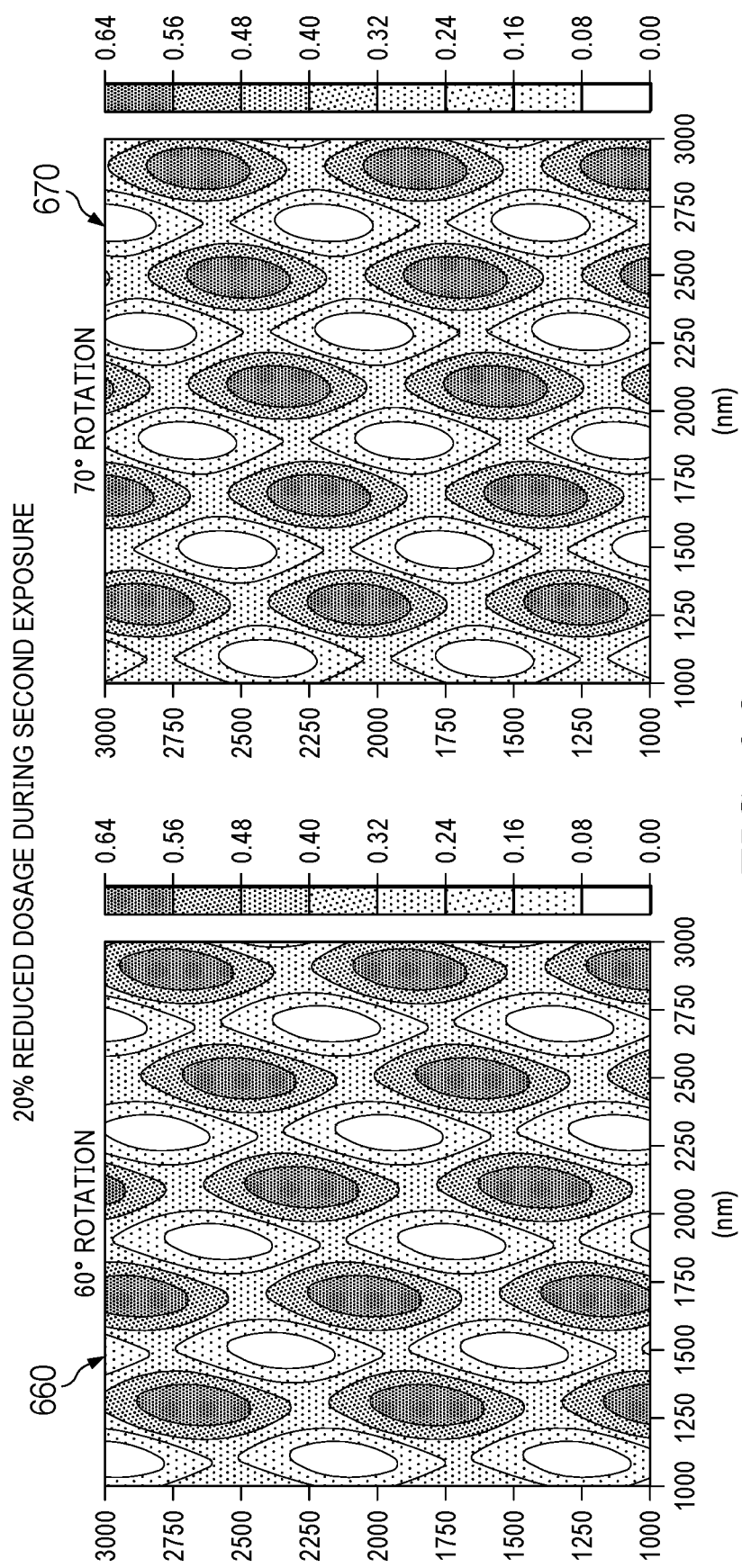
Figures 4, 6:
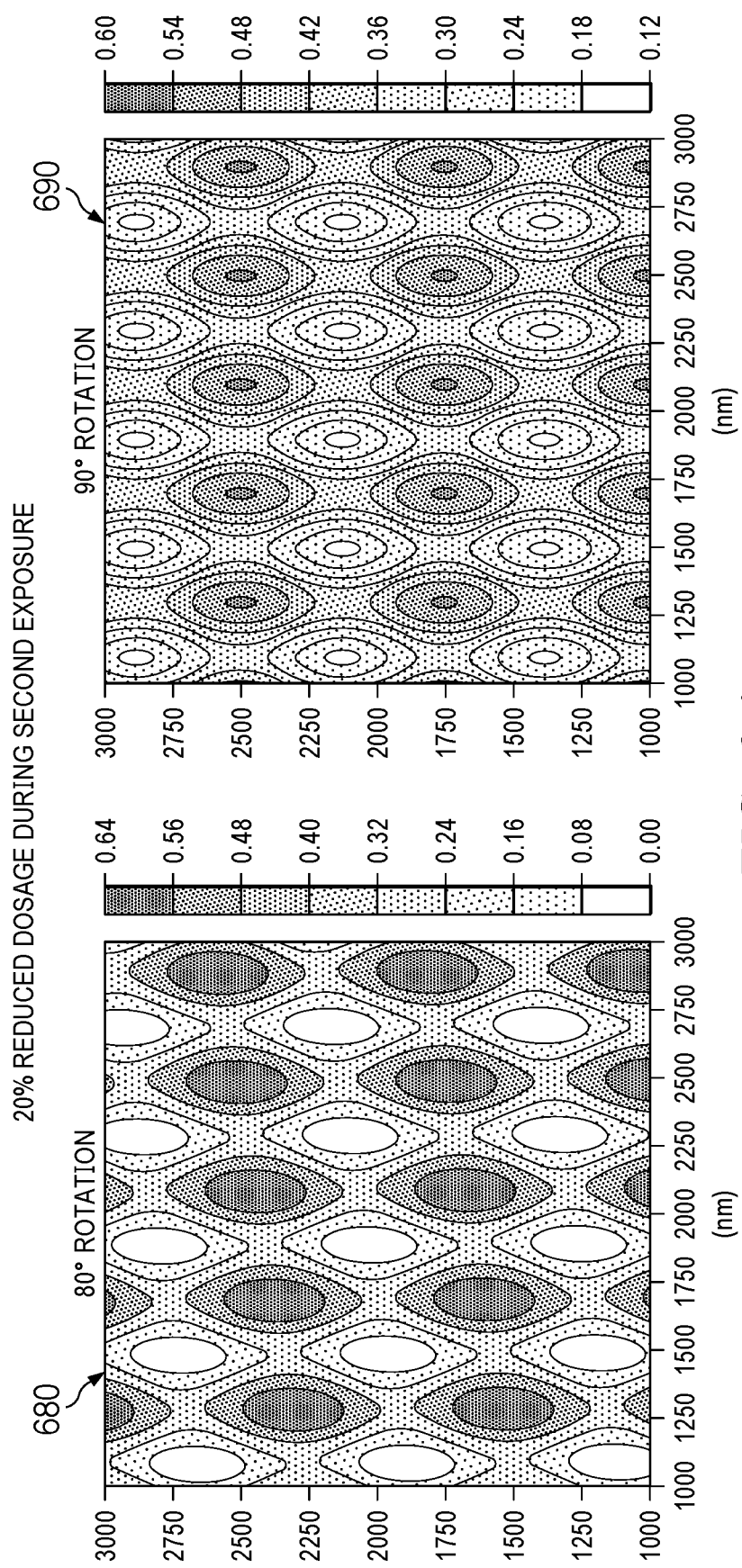

FIG. 6 depicts eight distinct 2D photoresist masking patterns 620, 630, 640, 650, 660, 670, 680, 690 generated by rotationally adjusting a 1D mask (such as one of 1D masks 110, 210, 310, 410 of FIGS. 1-4, respectively) for a second exposure in a manner similar to that described above with respect to the 2D photoresist masking patterns 520, 530, 540, 550, 560, 570, 580, 590 of FIG. 5. However, the second exposure used to generate the 2D photoresist masking patterns 620, 630, 640, 650, 660, 670, 680, 690 involves reducing the dosage used during that second exposure by 20%. In various embodiments and scenarios, the dosage may be modified in a variety of manners. As non-limiting examples, one or more successive exposures may be modified by adjusting one or more of an intensity of the light source (such as annular light source 101 of FIGS. 1-4), a duration in which the photoresist layer is exposed, and/or a wavelength of the light source.

In particular, and in a manner similar to that described above with respect to FIG. 5, photoresist layer 620 is generated by rotating a 1D mask by 20° for a second exposure; photoresist layer 630 is generated by rotating the 1D mask by 30° for the second exposure; photoresist layer 640 is generated by rotating the 1D mask by 40° for the second exposure; photoresist layer 650 is generated by rotating the 1D mask by 60° for the second exposure; photoresist layer 660 is generated by rotating the 1D mask by 60° for the second exposure; photoresist layer 670 is generated by rotating the 1D mask by 70° for the second exposure; photoresist layer 680 is generated by rotating the 1D mask by 80° for the second exposure; and photoresist layer 690 is generated by rotating the 1D mask by 90° for the second exposure. However, for all of the photoresist layers 620, 630, 640, 650, 660, 670, 680, 690, the dosage of the second exposure is reduced by 20%.

As can be seen from the respective photoresist layers depicted in FIG. 6, the resulting unit cell patterns, as well as the shape of their respective internal high-intensity and low-intensity exposure regions, vary in a manner distinct from the variations presented in the corresponding unit cell patterns of FIG. 5. In particular, the reduced dosage of the second exposure results in varied elongation of the respective high-intensity regions and low-intensity regions presented by the photoresist layers 620, 630, 640, 650, 660, 670, 680, 690.

Thus, in addition to configuring and generating disparate varieties of developed photoresist masking patterns by tuning their respective development thresholds and/or rotation angle, additional varieties of photoresist masking patterns may be configured and generated by adjusting a dosage to which the photoresist layer underlying the 1D mask is successively exposed.

In various scenarios and embodiments, a unit cell pattern generated for a 2D photolithographic mask may be tuned by modifying one or more parameters of a second 1D mask used to expose the 2D photolithographic mask to a light source during one or more successive exposures, as described below.

Figures 1, 7:
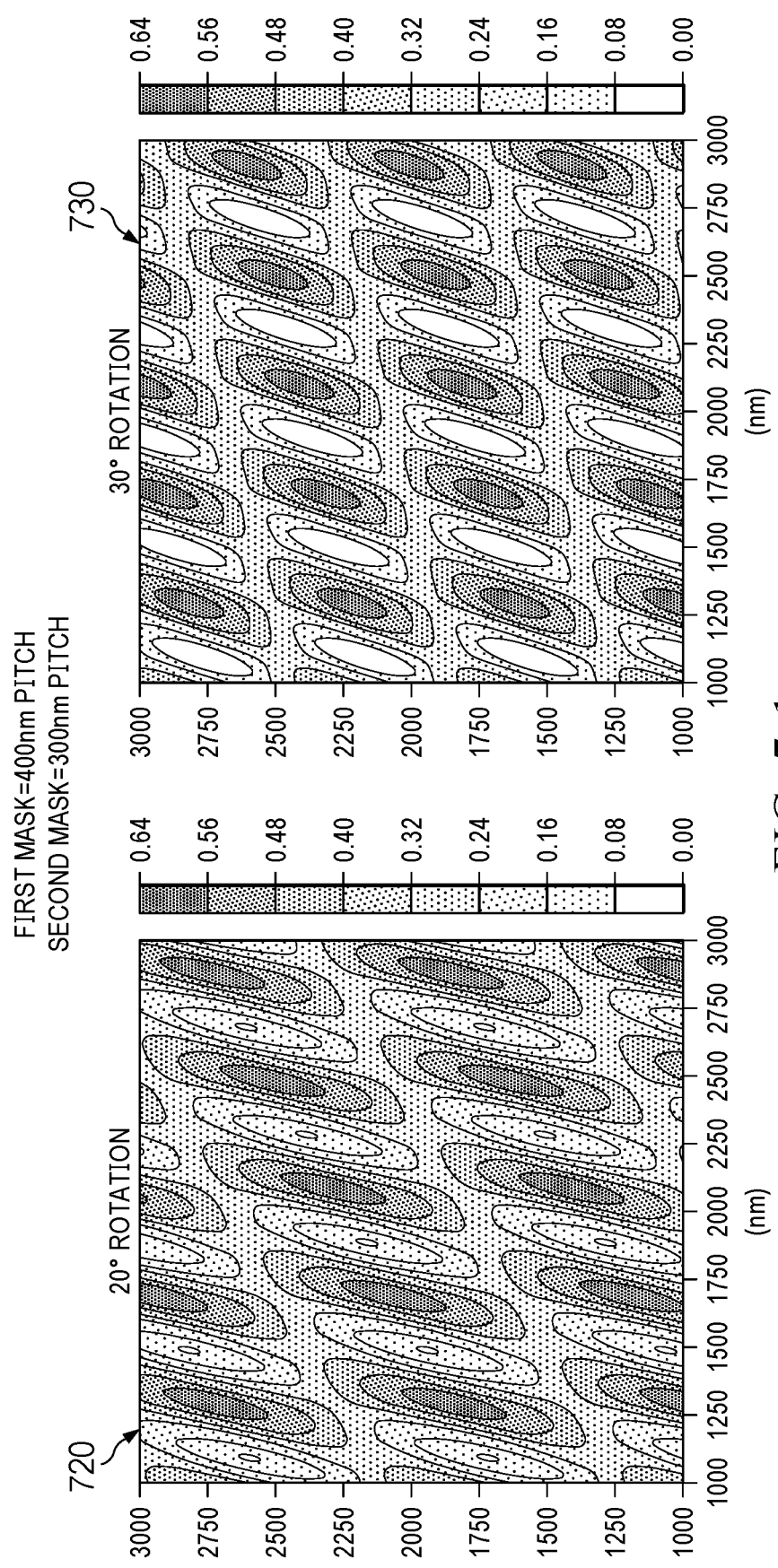
Figures 2, 7:
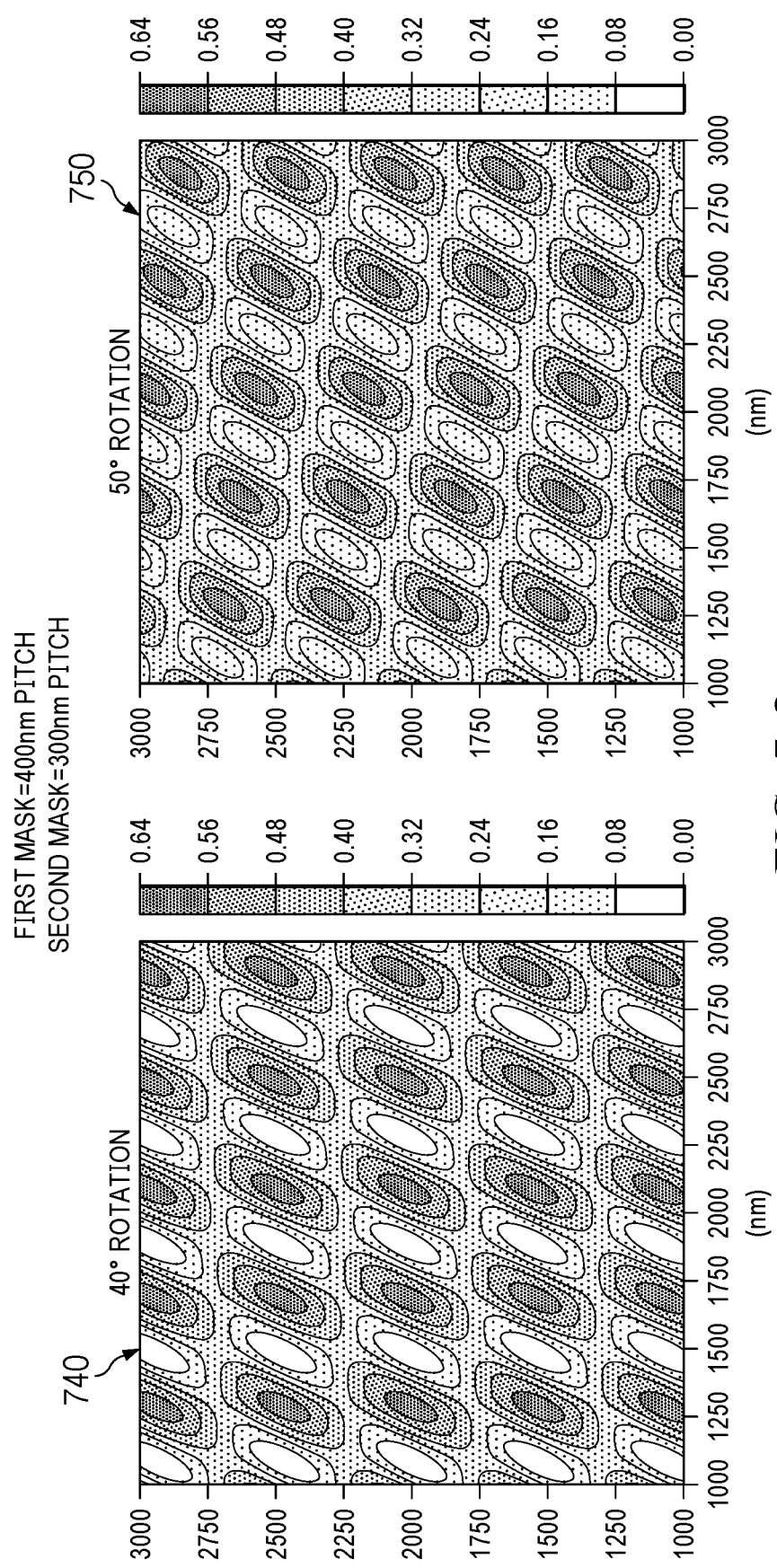
Figures 3, 7:
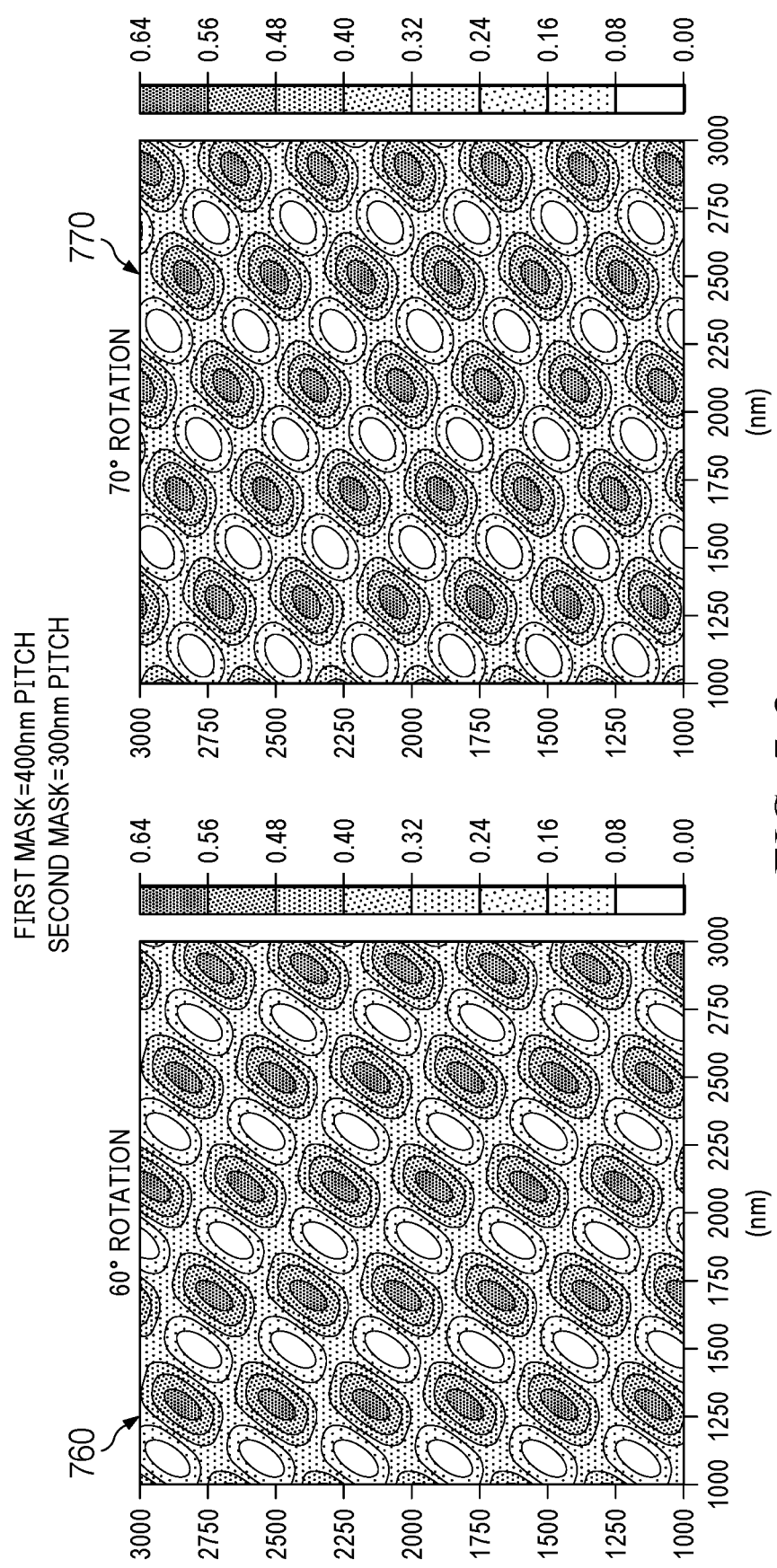
Figures 4, 7:
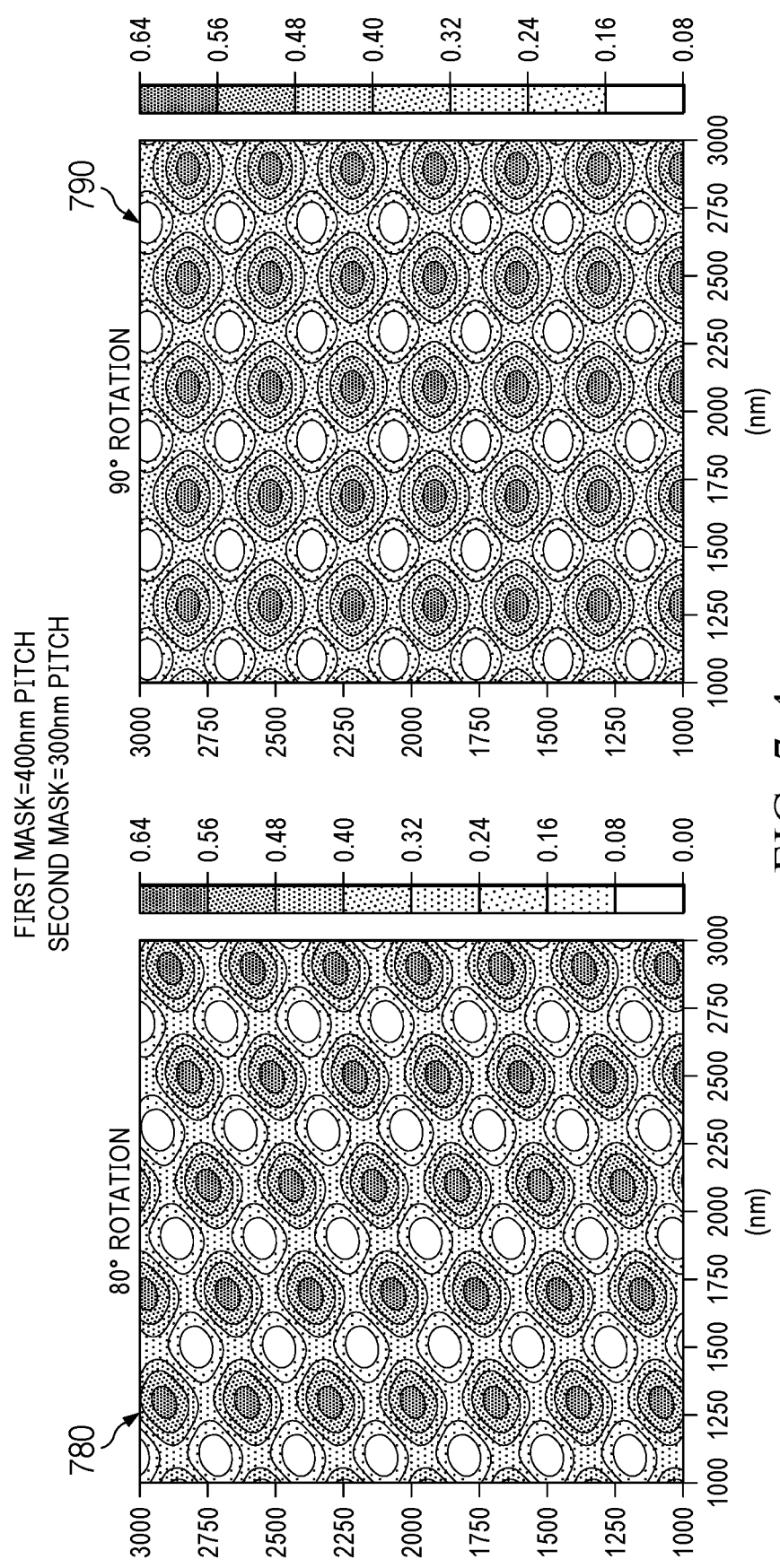

FIG. 7 depicts eight distinct 2D photoresist masking patterns 720, 730, 740, 750, 760, 770, 780, 790 generated by rotationally adjusting a 1D mask (such as one of 1D masks 110, 210, 310, 410 of FIGS. 1-4, respectively) for a second exposure in a manner similar to that described above with respect to the 2D photoresist masking patterns 520, 530, 540, 550, 560, 570, 580, 590 of FIG. 5 and 620, 630, 640, 650, 660, 670, 680, 690 of FIG. 6. However, the second exposure used to generate the 2D photoresist masking patterns 720, 730, 740, 750, 760, 770, 780, 790 is performed using a second 1D mask with parameters distinct from a first 1D mask used during the first exposure. In particular, in the depicted example of FIG. 7, each of the 2D photoresist masking patterns 720, 730, 740, 750, 760, 770, 780, 790 has been exposed to a light source during a first exposure via a first 1D mask having a pitch of 400 nm, and then exposed to that light source during a second exposure via a rotated second 1D mask having a pitch of 300 nm (such that the repeating features of the second 1D mask are more closely spaced than those of the first 1D mask).

In various embodiments and scenarios, various parameters of the respective 1D masks (or those used in respective configurations of interference patterns provided via holographic lithography) may be distinct during successive exposures of a photoresist layer, such that a first unidimensional series of features of the 1D mask used for the first exposure is defined by a first set of parameters, and a second unidimensional series of features of the 1D mask used for one or more successive exposures is defined by a second set of parameters that is at least partially distinct from the first set of parameters. As non-limiting examples, such parameters may include a pitch, fill factor, etc.

As example, and in a manner similar to that described above with respect to FIGS. 5 and 6 above, photoresist layer 720 is generated by rotating a 1D mask by an exposure rotation factor of 20° for a second exposure; photoresist layer 730 is generated by rotating the 1D mask by an exposure rotation factor of 30° for the second exposure; photoresist layer 740 is generated by rotating the 1D mask by an exposure rotation factor of 40° for the second exposure; photoresist layer 750 is generated by rotating the 1D mask by an exposure rotation factor of 50° for the second exposure; photoresist layer 760 is generated by rotating the 1D mask by an exposure rotation factor of 60° for the second exposure; photoresist layer 770 is generated by rotating the 1D mask by an exposure rotation factor of 70° for the second exposure; photoresist layer 780 is generated by rotating the 1D mask by an exposure rotation factor of 80° for the second exposure; and photoresist layer 790 is generated by rotating the 1D mask by an exposure rotation factor of 90° for the second exposure. However, the first 1D mask used for the first exposure is defined by a 400 nm pitch between its periodic features, while a second 1D mask used for the second exposure is correspondingly defined by a 300 nm pitch. As can be seen from the respective 2D photoresist masking patterns 720, 730, 740, 750, 760, 770, 780, 790, the resulting unit cell patterns, as well as the shape of their respective internal high-intensity and low-intensity exposure regions, vary in a manner distinct from the variations presented in the corresponding unit cell patterns of FIGS. 5 and 6.

Thus, in addition to configuring and generating disparate varieties of developed photoresist masking patterns by tuning their respective development thresholds, rotation angle, and dosage, additional varieties of photoresist masking patterns may be configured and generated by adjusting one or more parameters of a 1D mask used for one or more successive exposures.

Figure 8:
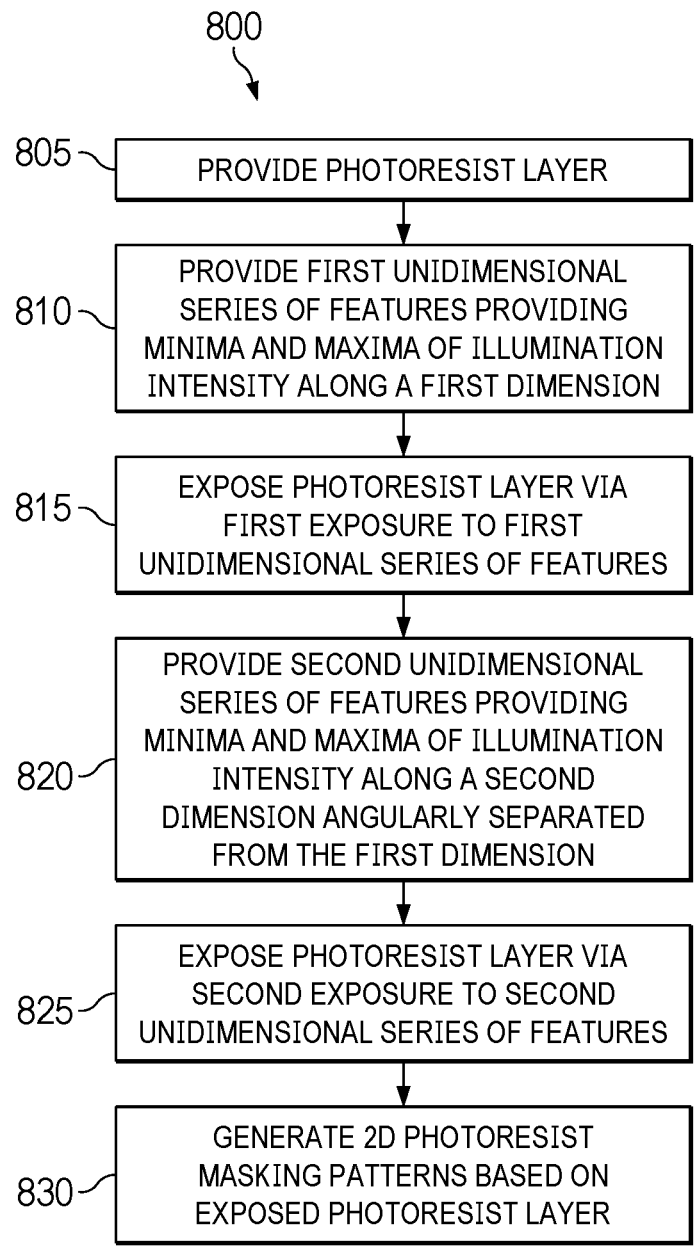
FIG. 8 illustrates an example flow diagram for an operational routine for generating a two-dimensional pattern on a photoresist layer in accordance with some embodiments.

FIG. 8 illustrates an example flow diagram for an operational routine 800 for generating a two-dimensional pattern on a photoresist layer in accordance with some embodiments.

The routine proceeds at block 805, in which a photoresist layer is provided. The routine proceeds to block 810.

At block 810, a first unidimensional series of features is provided, such that the features provide minima and maxima of illumination intensity along a first dimension. The routine proceeds to block 815.

At block 815, the photoresist layer is exposed to the first unidimensional series of features during a first exposure. The routine proceeds to block 820.

At block 820, a second unidimensional series of features is provided, such that the features provide minima and maxima of illumination intensity along a second dimension. The routine proceeds to block 825.

At block 825, the photoresist layer is exposed to the second unidimensional series of features during a second exposure. The routine proceeds to block 830.

At block 830, one or more two-dimensional photoresist masking patterns are generated based on the exposed photoresist layer.

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disk, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method, comprising:
exposing a photoresist layer via a first exposure to a first interference pattern to form a first unidimensional series of features, wherein the first unidimensional series of features provides alternating first minima and maxima of illumination intensity along a first dimension; and
exposing the photoresist layer via a second exposure to a second interference pattern to form a second unidimensional series of features, the second interference pattern being rotated relative to the first interference pattern such that the second unidimensional series of features provides alternating second minima and maxima of illumination intensity along a second dimension that is angularly separated from the first dimension.

2. The method of claim 1, wherein exposing the photoresist layer via the first exposure comprises generating the first interference pattern via a one-dimensional (1D) masking layer positioned between the photoresist layer and a light source.

3. The method of claim 2, wherein exposing the photoresist layer via the second exposure comprises exposing the photoresist layer to the light source via the 1D masking layer positioned between the photoresist layer and the light source, and wherein the method further comprises generating the second interference pattern by rotating the 1D masking layer by an exposure rotation factor prior to exposing the photoresist layer via the second exposure.

4. The method of claim 1, wherein exposing the photoresist layer via the first exposure comprises exposing the photoresist layer to the first interference pattern via two or more coherent light sources.

5. The method of claim 4, further comprising rotating the first interference pattern by an exposure rotation factor to generate the second interference pattern.

6. The method of claim 1, wherein the first unidimensional series of features and the second unidimensional series of features are substantially identical.

7. The method of claim 1, wherein the first unidimensional series of features is defined by a first set of parameters, and wherein the second unidimensional series of features is defined by a second set of parameters that is at least partially distinct from the first set of parameters.

8. The method of claim 7, wherein the first and second set of parameters each include one or more of a group that includes a pitch or a fill factor.

9. The method of claim 1, further comprising generating one or more two-dimensional photoresist masking patterns based on the photoresist layer after the second exposure.

10. The method of claim 9, wherein generating the one or more two-dimensional photoresist masking patterns based on the exposed photoresist layer includes selecting one or more development parameters for each of the two-dimensional photoresist masking patterns.

11. A system, comprising:
a photoresist layer;
a first unidimensional series of features to provide first minima and maxima of illumination intensity along a first dimension during a first exposure of the photoresist layer via a first interference pattern; and
a second unidimensional series of features to alternatingly provide second minima and maxima of illumination intensity along a second dimension during a second exposure of the photoresist layer via a second interference pattern, wherein the second interference pattern is rotated relative to the first interference pattern such that the second dimension is angularly separated from the first dimension.

12. The system of claim 11, wherein the first interference pattern is generated via a one-dimensional (1D) masking layer positioned between the photoresist layer and a light source, and wherein the first exposure comprises exposing the photoresist layer to the light source via the 1D masking layer.

13. The system of claim 12, wherein the second interference pattern is generated by rotating the 1D masking layer by an exposure rotation factor prior to the second exposure.

14. The system of claim 11, wherein the first unidimensional series of features comprises an interference pattern between two or more coherent light sources.

15. The system of claim 14, wherein the second interference pattern is substantially identical to the first interference pattern rotated by an exposure rotation factor prior to the second exposure.

16. The system of claim 11, wherein the first unidimensional series of features and the second unidimensional series of features are substantially identical.

17. The system of claim 11, wherein the first unidimensional series of features is defined by a first set of parameters, and wherein the second unidimensional series of features is defined by a second set of parameters that is at least partially distinct from the first set of parameters.

18. The system of claim 11, further comprising a photoresist developer to generate one or more two-dimensional photoresist masking patterns based on the photoresist layer after the second exposure.

19. The system of claim 18, wherein the photoresist developer is configured to select one or more development parameters for each of the two-dimensional photoresist masking patterns.

20. A method, comprising:
providing, to a photoresist layer via a masking layer interposed between the photoresist layer and a light source, a first interference pattern alternating first minima and maxima of illumination intensity along a first dimension; and
providing, to the photoresist layer and via rotating the masking layer, a second interference pattern alternating second minima and maxima of illumination intensity along a second dimension that is angularly separated from the first dimension.

* * * * *